US008704514B2

(12) United States Patent
Motz et al.

(10) Patent No.: US 8,704,514 B2
(45) Date of Patent: Apr. 22, 2014

(54) CURRENT SENSOR INCLUDING A SINTERED METAL LAYER

(75) Inventors: Mario Motz, Wernberg (AT); Udo Ausserlechner, Villach (AT); Martin Mischitz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 417 days.

(21) Appl. No.: 12/704,069

(22) Filed: Feb. 11, 2010

(65) Prior Publication Data

US 2011/0193557 A1 Aug. 11, 2011

(51) Int. Cl.
*G01R 33/02* (2006.01)

(52) U.S. Cl.
USPC ........... 324/252; 324/263; 324/234; 324/235; 324/236

(58) Field of Classification Search
USPC ........................................... 324/234–263
See application file for complete search history.

(56) References Cited

U.S. PATENT DOCUMENTS 4,860,138 A * 8/1989 Vinal et al. ............... 360/327.24
5,514,327 A * 5/1996 Schneider ....................... 419/36
5,757,179 A * 5/1998 McCurley et al. .......... 324/207.2
6,545,456 B1 4/2003 Radosevich et al.
6,566,872 B1 * 5/2003 Sugitani ........................ 324/249
6,921,626 B2 7/2005 Ray et al.
7,250,748 B2 7/2007 Hastings et al.
7,253,601 B2 8/2007 Ishio
7,400,132 B2 7/2008 Ishihara
7,442,879 B2 10/2008 Das et al.
7,458,150 B2 * 12/2008 Totokawa et al. ............... 29/852
7,476,816 B2 * 1/2009 Doogue et al. ................ 174/528
7,482,814 B2 * 1/2009 Schill et al. .................. 324/457
2004/0021463 A1 * 2/2004 Miyazawa et al. ............ 324/252
2007/0262773 A1 * 11/2007 Witcraft et al. .............. 324/252
2009/0072013 A1 3/2009 Natekar et al.
2011/0193217 A1 * 8/2011 Meyer-Berg .................. 257/734

FOREIGN PATENT DOCUMENTS

JP 2002299833 A * 10/2002

* cited by examiner

*Primary Examiner* — Huy Q Phan
*Assistant Examiner* — Temilade S Rhodes-Vivour
(74) *Attorney, Agent, or Firm* — Dicke, Billig & Czaja, PLLC

(57) ABSTRACT

An integrated circuit includes a semiconductor die including a first magnetic field sensor. The integrated circuit includes an isolation material layer over the first magnetic field sensor and a sintered metal layer over the isolation material layer. The first magnetic field sensor is configured to sense a magnetic field generated by a current passing through the sintered metal layer.

16 Claims, 6 Drawing Sheets

100
HOST
102
104
CURRENT SENSOR
106

CURRENT SENSOR INCLUDING A SINTERED METAL LAYER

BACKGROUND

Typical current sensors utilizing magnetic field sensors for measuring current include a conductor and a magnetic field sensor. A current passing through the conductor generates a magnetic field that is sensed by the magnetic field sensor. The sensed magnetic field in turn provides an indication of the current passing through the conductor. Typical current sensors of this type may use special lead frames for the conductor, may include a magnetic core, and/or may include special magnetic layers. Each of these typical current sensors use expensive fabrication processes and may not reject disturbance magnetic fields.

For these and other reasons, there is a need for the present invention.

SUMMARY

One embodiment provides an integrated circuit. The integrated circuit includes a semiconductor die including a first magnetic field sensor. The integrated circuit includes an isolation material layer over the first magnetic field sensor and a sintered metal layer over the isolation material layer. The first magnetic field sensor is configured to sense a magnetic field generated by a current passing through the sintered metal layer.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
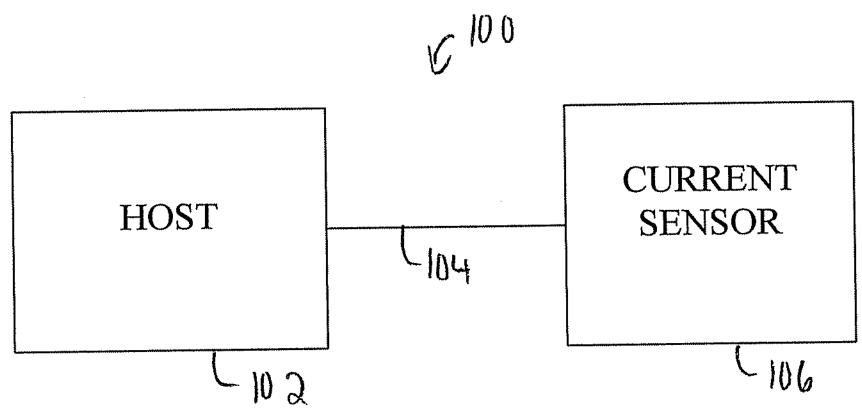
FIG. 1 is a block diagram illustrating one embodiment of a system.

FIG. 1 is a block diagram illustrating one embodiment of a system 100. System 100 includes a host 102 and a current sensor 106. Host 106 is communicatively coupled to current sensor 106 through communication link 104. Host 102 includes a computer, microprocessor, controller, microcontroller, and/or other suitable logic circuitry for controlling the operation of current sensor 106. In one embodiment, host 102 passes power signals to current sensor 106 and receives current measurement signals from current sensor 106 through communication link 104.

Current sensor 106 is a galvanic isolated current sensor including an integrated circuit having one or more monolithic integrated magnetic field sensor elements, an isolation layer, and a sintered metal layer. The one or more magnetic field sensor elements are electrically isolated from the sintered metal layer via the isolation layer. The sintered metal layer provides a current conductor through which the current to be sensed passes. A current passing through the sintered metal layer generates a magnetic field proportional to the current. The one or more magnetic field sensors sense the generated magnetic field to provide a measurement signal for the current.

System 100 can be used in a variety of applications where a current is to be measured. For example, host 102 may be part of an electric or hybrid automobile or vehicle control system and current sensor 106 may be used to measure the current supplied by the automobile's or vehicle's batteries. In other embodiments, system 100 is used in other suitable applications.

Figure 2:
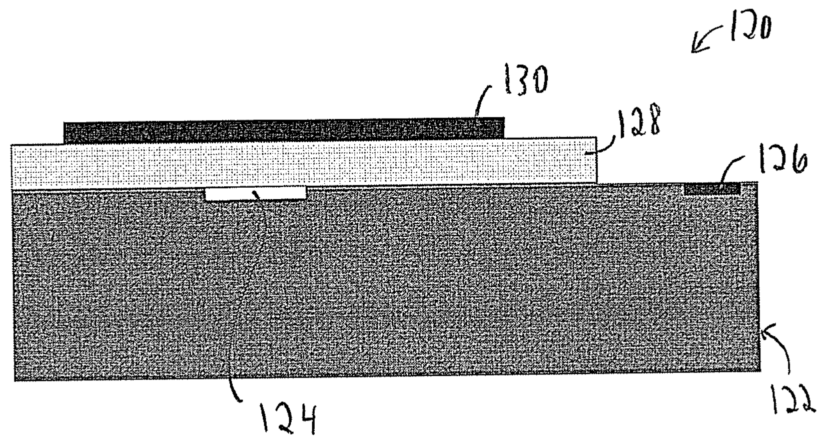
FIG. 2 illustrates a cross-sectional view of one embodiment of a current sensor.

FIG. 2 illustrates a cross-sectional view of one embodiment of a current sensor 120. In one embodiment, current sensor 120 provides current sensor 106 previously described and illustrated with reference to FIG. 1. Current sensor 120 includes a semiconductor die 122, an isolation layer 128, and a sintered metal layer 130. Semiconductor die 122 includes at least one magnetic field sensor 124, a contact 126, and other elements (e.g., power amplifiers, protection diodes, resistors, and other circuit elements) electrically coupled to magnetic field sensor 124 and/or contact 126. Magnetic field sensor 124 includes a Hall sensor, a giant magnetoresistive (GMR) sensor, an anisotropic magnetoresistive sensor (AMR), a tunnel magnetoresistive (TMR) sensor, or other suitable magnetic field sensor.

In one embodiment, semiconductor die 122 is a silicon die fabricated using complementary metal-oxide-semiconductor (CMOS) processes or other suitable processes. An isolation material, such as $SiO_2$, polyimide, or other suitable isolation material is deposited over magnetic field sensor 124 to provide isolation layer 128. In one embodiment, the isolation material is selectively deposited over magnetic field sensor 124 to provide isolation layer 128. In another embodiment, the isolation material is deposited over the entire semiconductor die 122 and then removed from over contact 126 to provide isolation layer 128. In one embodiment, isolation layer 128 has a thickness between approximately 10 μm and 20 μm and provides greater than approximately 2 kV isolation between semiconductor die 122 and sintered metal layer 130.

A metal paste is then applied over isolation layer 128. In one embodiment, the metal paste includes nano particles and/or micro particles of metal, such as Ag, Cu, Au, and/or other suitable metals and/or metal precursor compounds. In another embodiment, the metal paste includes solder paste. The metal paste also includes one or more solvents to control the viscosity of the metal paste. In one embodiment, the solvents of the metal paste are selected to decompose at a temperature within the range of 80° C. to 400° C.

In one embodiment, an adhesion promoting metal layer is deposited over isolation layer 128 prior to applying the metal paste. The adhesion promoting metal layer is deposited by sputtering, printing, or another suitable deposition technique. The metal paste is applied over the adhesion promoting metal layer or isolation layer 128 by screen printing, stencil printing, inkjet printing, a combination thereof, or another suitable technique. In one embodiment, the metal paste is applied to a thickness between 5 μm and 100 μm, such as 50 μm. The metal paste is dried and sintered at a temperature between 80° C. and 400° C. to provide sintered metal layer 130.

Sintered metal layer 130 provides the current conductor for current sensor 120. Sintered metal layer 130 has a low resistance and is less expensive to fabricate compared to typical current sensors. In addition, sintered metal layer 130 can be adjusted to magnetic field sensor 124 in semiconductor die 122 by using wafer fabrication masks. Multiple magnetic field sensor elements can be positioned relative to sintered metal layer 130 such that external disturbance magnetic fields are rejected (e.g., differential Hall sensors, triple Hall sensors, differential GMR sensors, differential TMR sensors, etc.). The fabrication process of current sensor 120 avoids expensive packaging costs and expensive special process steps compared to typical current sensors.

In another embodiment, sintered metal layer 130 is also used to homogenize the temperature gradient across semiconductor die 122. The temperature gradient may originate from power dissipation within semiconductor die 122 due to power amplifiers, protection diodes, resistors, and/or similar circuit elements. The temperature gradient may also originate from dissipation within sintered metal layer 130 itself due to the flow of high current through sintered metal layer 130. Therefore, in one embodiment, sintered metal layer 130 is fabricated larger (i.e., thicker and/or larger area) than needed for pure current conduction purposes to spread out the heat across a larger area and to homogenize the temperature gradient.

In another embodiment, sintered metal layer 130 is also used to increase the maximum rating of an integrated circuit, especially if the maximum rating is limited by thermal heating. For example, if an electrostatic discharge (ESD) diode heats up in an event of a high voltage pulse a large area covered by sintered metal layer 130 may increase not only the thermal resistance of the junction to ambient but also the thermal capacitance.

Figure 3:
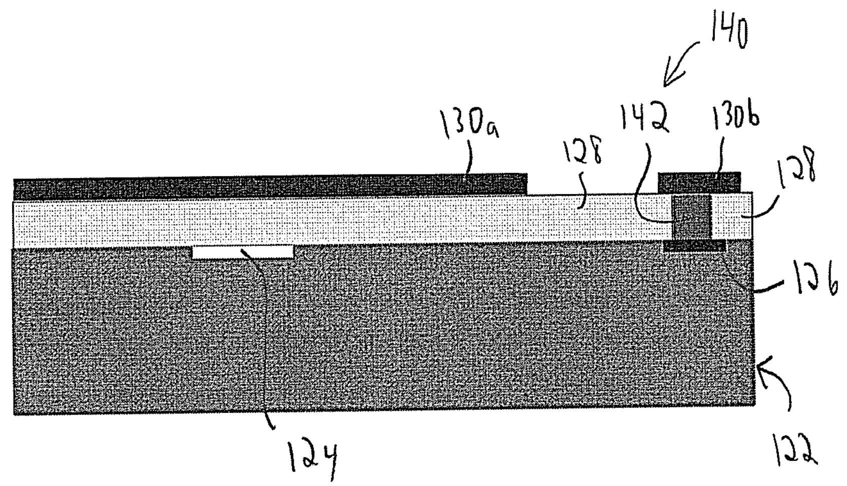
FIG. 3 illustrates a cross-sectional view of another embodiment of a current sensor.

FIG. 3 illustrates a cross-sectional view of another embodiment of a current sensor 140. In one embodiment, current sensor 140 provides current sensor 106 previously described and illustrated with reference to FIG. 1. Current sensor 140 is similar to current sensor 120 previously described and illustrated with reference to FIG. 2, except that current sensor 140 includes a contact **130*b* electrically coupled to contact 126 through via 142**.

In this embodiment, isolation layer 128 covers the face of semiconductor die 122 and laterally surrounds via 142. Via 142 includes a conductive material that electrically couples contact 126 of semiconductor die 122 to contact **130*b*. Contact 130*b* is part of sintered metal layer 130. Portion 130*a* of sintered metal layer 130 provides the current conductor for current sensor 140. Current sensor 140 is fabricated using a process similar to the process used to fabricate current sensor 120 previously described and illustrated with reference to FIG. 2**.

Figure 4A:
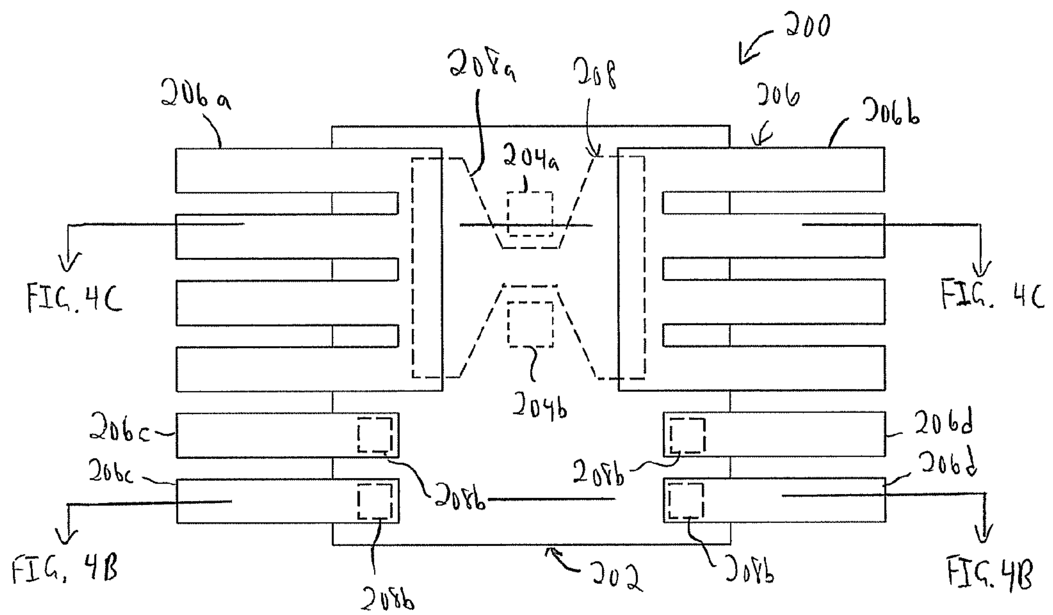
FIG. 4A illustrates a bottom view of another embodiment of a current sensor.
Figure 4B:
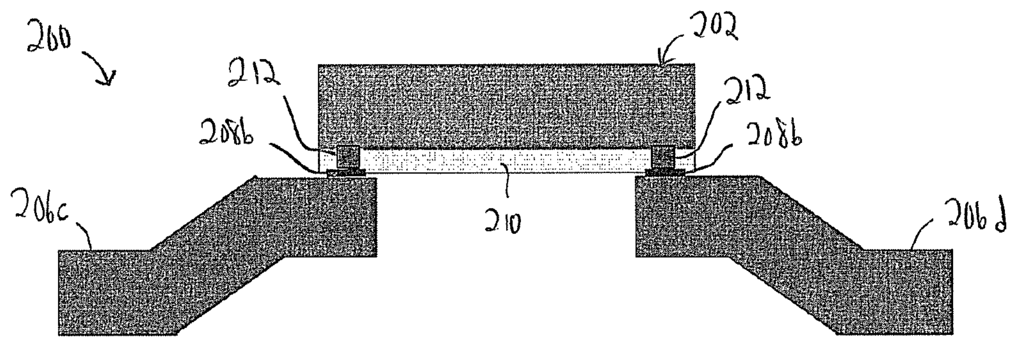
FIG. 4B illustrates a first cross-sectional view of one embodiment of the current sensor illustrated in FIG. 4A.
Figure 4C:
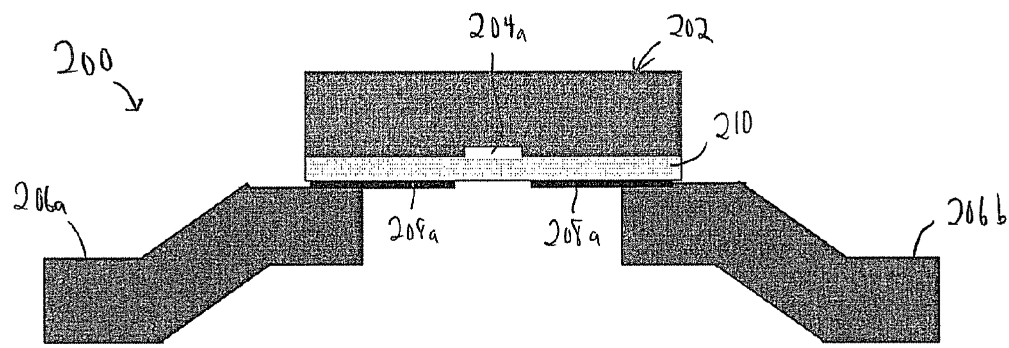
FIG. 4C illustrates a second cross-sectional view of one embodiment of the current sensor illustrated in FIG. 4A.

FIG. 4A illustrates a bottom view of another embodiment of a current sensor 200. FIG. 4B illustrates a first cross-sectional view and FIG. 4C illustrates a second cross-sectional view of current sensor 200 as indicated in FIG. 4A. Current sensor 200 is a face down mounted current sensor on a lead frame. In one embodiment, current sensor 200 provides current sensor 106 previously described and illustrated with reference to FIG. 1. Current sensor 200 includes a semiconductor die 202, an isolation layer 210, vias 212, a sintered metal layer 208, and a lead frame 206.

Semiconductor die 202 includes two magnetic field sensors **204*a* and 204*b* and other elements (e.g., contacts, power amplifiers, protection diodes, resistors, and other circuit elements) electrically coupled to magnetic field sensors 204*a* and 204*b*. In other embodiments, semiconductor die 202 includes another suitable number of magnetic field sensors. In this embodiment, magnetic field sensors 204*a* and 204*b* include Hall sensors or other suitable magnetic field sensors. Isolation layer 210 covers the face of semiconductor die 202 and laterally surrounds vias 212. Each via 212 includes a conductive material that electrically couples semiconductor die 202 to a contact 208*b*. Contacts 208*b* are part of sintered metal layer 208**.

Portion **208*a* of sintered metal layer 208 provides the current conductor for current sensor 200. Portion 208*a* of sintered metal layer 208 is I-shaped such that magnetic field sensor 204*a* is located adjacent one side of the center of the I-shaped conductor and magnetic field sensor 204*b* is located adjacent the other side of the center of the I-shaped conductor. In this way, a differential current sensor is provided that rejects external disturbance magnetic fields. In other embodiments, portion 208*a* of sintered metal layer 208 has other suitable shapes based on the number, type, and location of the magnetic field sensors in semiconductor die 202**.

Portions **208*b* of sintered metal layer 208 on a first side of semiconductor die 202 are coupled to leads 206*c* of lead frame 206. Portions 208*b* of sintered metal layer 208 on a second side of semiconductor die 202 opposite the first side are coupled to leads 206*d* of lead frame 206. In one embodiment, leads 206*c* and 206*d* of lead frame 206 are electrically coupled to a host to receive power from the host for current sensor 200 and to provide current measurement signals to the host from current sensor 200**.

A first side of portion **208*a* of sintered metal layer 208 is coupled to leads 206*a* of lead frame 206. A second side of portion 208***a* of sintered metal layer 208 opposite the first side is coupled to leads 206*b* of lead frame 206. In one embodiment, leads 206*a* and 206*b* are electrically coupled to a circuit such that the current to be measured passes through portion 208*a* of sintered metal layer 208. A current passing through portion 208*a* of sintered metal layer 208 generates a positive magnetic field at one of magnetic field sensors 204*a* and 204*b* and a negative magnetic field at the other one of magnetic field sensors 204*a* and 204*b*. In this way, current sensor 200 measures the magnetic field generated by sintered metal layer 208 differentially and rejects external disturbance magnetic fields.

Semiconductor die 202, isolation layer 210, and sintered metal layer 208 are fabricated using a process similar to the process used to fabricate current sensor 120 previously described and illustrated with reference to FIG. 2. In this embodiment, isolation layer 210 has a thickness of approximately 14 μm and sintered metal layer 208 has a thickness between 20 μm and 50 μm. In other embodiments, isolation layer 210 has another suitable thickness and sintered metal layer 208 has another suitable thickness. Semiconductor die 202, isolation layer 210, and sintered metal layer 208 are then placed in a face down mounting arrangement on lead frame 206 and soldered to lead frame 206 or attached to lead frame 206 using another suitable technique.

Figure 5A:
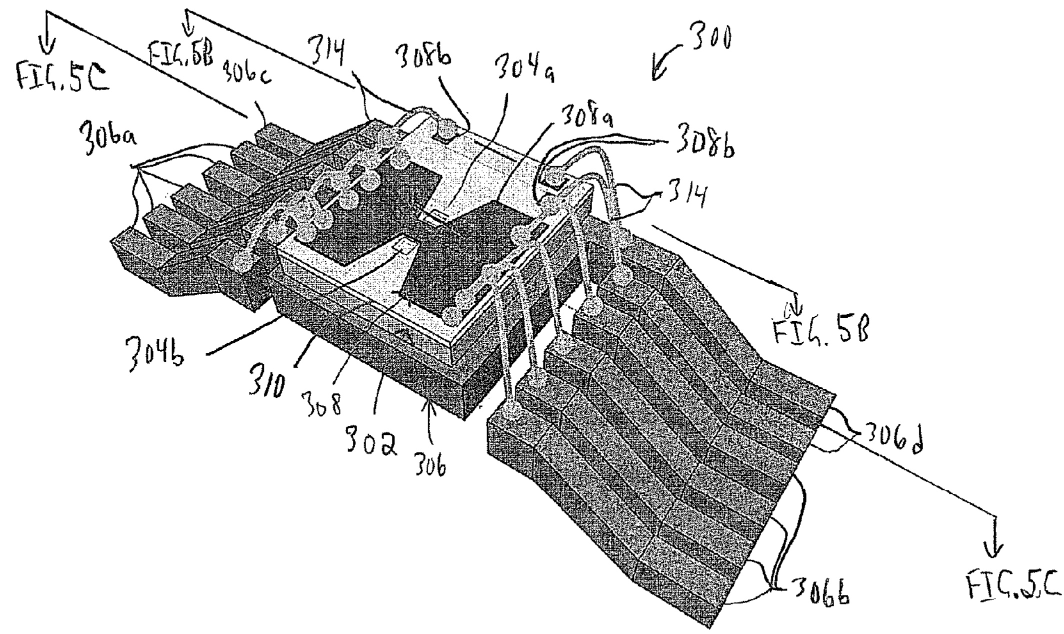
FIG. 5A illustrates a perspective view of another embodiment of a current sensor.
Figure 5B:
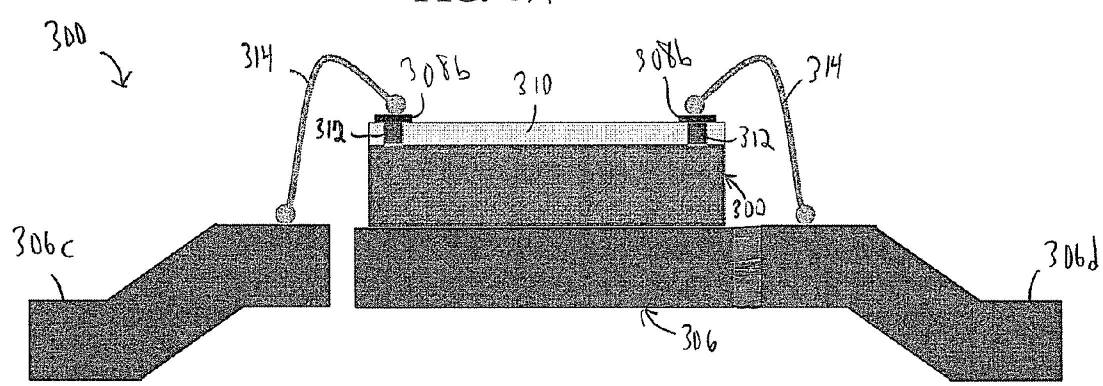
FIG. 5B illustrates a first cross-sectional view of one embodiment of the current sensor illustrated in FIG. 5A.
Figure 5C:
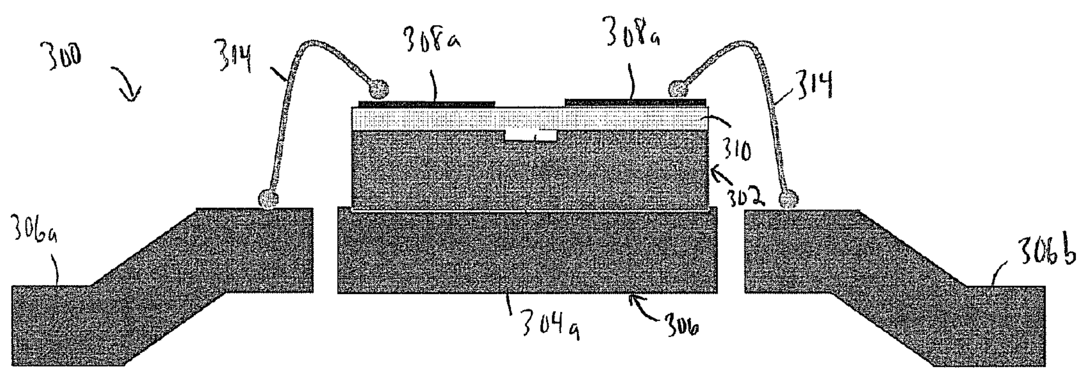
FIG. 5C illustrates a second cross-sectional view of one embodiment of the current sensor illustrated in FIG. 5A.

FIG. 5A illustrates a perspective view of another embodiment of a current sensor 300. FIG. 5B illustrates a first cross-sectional view and FIG. 5C illustrates a second cross-sectional view of current sensor 300 as indicated in FIG. 5A. Current sensor 300 is a face up mounted current sensor on a lead frame. In one embodiment, current sensor 300 provides current sensor 106 previously described and illustrated with reference to FIG. 1. Current sensor 300 includes a semiconductor die 302, an isolation layer 310, vias 312, a sintered metal layer 308, bond wires 314, and a lead frame 306.

Semiconductor die 302 includes two magnetic field sensors 304*a* and 304*b* and other elements (e.g., contacts, power amplifiers, protection diodes, resistors, and other circuit elements) electrically coupled to magnetic field sensors 304*a* and 304*b*. In other embodiments, semiconductor die 302 includes another suitable number of magnetic field sensors. In this embodiment, magnetic field sensors 304*a* and 304*b* include Hall sensors or other suitable magnetic field sensors. Isolation layer 310 covers the face of semiconductor die 302 and laterally surrounds vias 312. Each via 312 includes a conductive material that electrically couples semiconductor die 302 to a contact 308*b*. Contacts 308*b* are part of sintered metal layer 308.

Portion 308*a* of sintered metal layer 308 provides the current conductor for current sensor 300. Portion 308*a* of sintered metal layer 308 is I-shaped such that magnetic field sensor 304*a* is located adjacent one side of the center of the I-shaped conductor and magnetic field sensor 304*b* is located adjacent the other side of the center of the I-shaped conductor. In this way, a differential current sensor is provided that rejects external disturbance magnetic fields. In other embodiments, portion 308*a* of sintered metal layer 308 has other suitable shapes based on the number, type, and location of the magnetic field sensors in semiconductor die 302.

Portions 308*b* of sintered metal layer 308 on a first side of semiconductor die 302 are coupled to leads 306*c* of lead frame 306 through bond wires 314. Portions 308*b* of sintered metal layer 308 on a second side of semiconductor die 302 opposite the first side are coupled to leads 306*d* of lead frame 306 through bond wires 314. In one embodiment, leads 306*c* of lead frame 306 are electrically coupled to a host to provide current measurement signals to the host from current sensor 300. In one embodiment, leads 306*d* of lead frame 306 are electrically coupled to a host to receive power from the host for current sensor 300.

A first side of portion 308*a* of sintered metal layer 308 is coupled to leads 306*a* of lead frame 306 through bond wires 314. A second side of portion 308*a* of sintered metal layer 308 opposite the first side is coupled to leads 306*b* of lead frame 306 through bond wires 314. In one embodiment, leads 306*a* and 306*b* are electrically coupled to a circuit such that the current to be measured passes through portion 308*a* of sintered metal layer 308. A current passing through portion 308*a* of sintered metal layer 308 generates a positive magnetic field at one of magnetic field sensors 304*a* and 304*b* and a negative magnetic field at the other one of magnetic field sensors 304*a* and 304*b*. In this way, current sensor 300 measures the magnetic field generated by sintered metal layer 308 differentially and rejects external disturbance magnetic fields.

Semiconductor die 302, isolation layer 310, and sintered metal layer 308 are fabricated using a process similar to the process used to fabricate current sensor 120 previously described and illustrated with reference to FIG. 2. In this embodiment, isolation layer 310 has a thickness between 10 μm and 20 μm and sintered metal layer 308 has a thickness of approximately 50 μm. In other embodiments, isolation layer 310 has another suitable thickness and sintered metal layer 308 has another suitable thickness. Semiconductor die 302, isolation layer 310, and sintered metal layer 308 are attached to lead frame 306 in a face up mounting arrangement. Bond wires 314 are then attached between sintered metal layer 308 and lead frame 306 using a suitable wire bonding technique.

Figure 6:
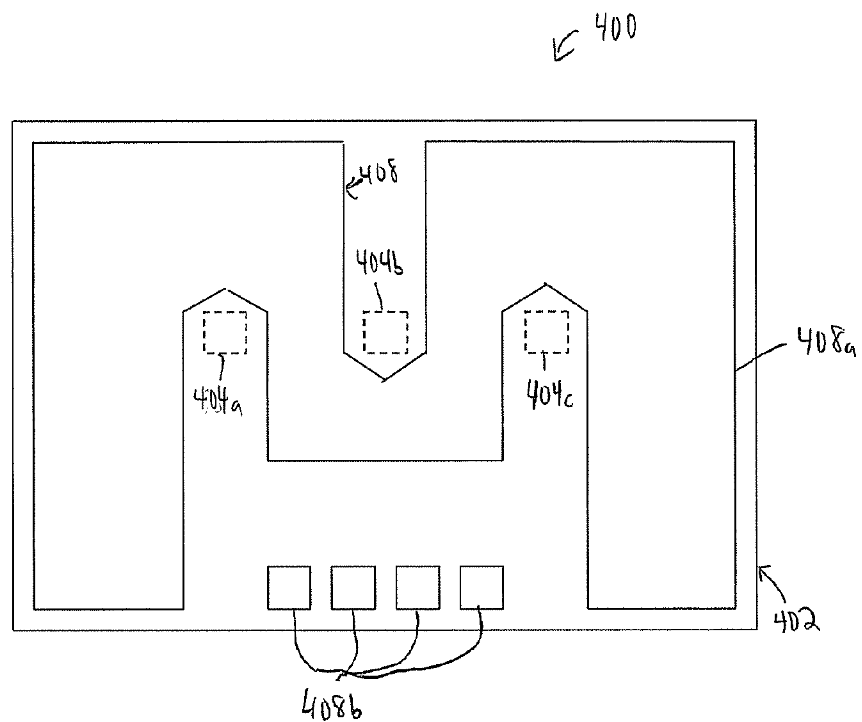
FIG. 6 illustrates a bottom view of another embodiment of a current sensor.
Figure 7:
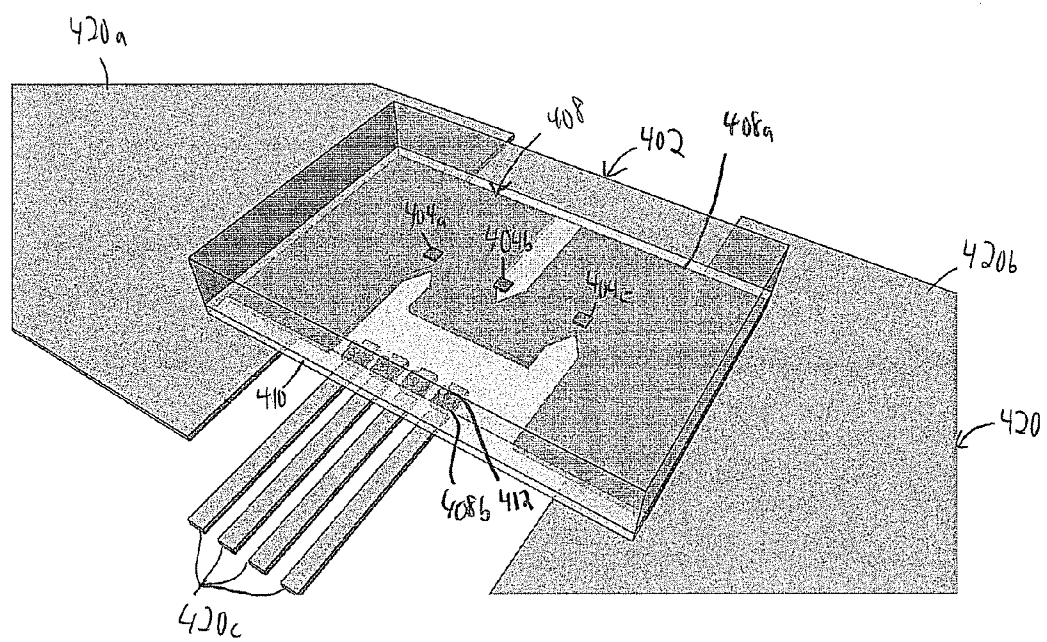
FIG. 7 illustrates a perspective view of one embodiment of the current sensor illustrated in FIG. 6 attached to a printed circuit board (PCB).

FIG. 6 illustrates a bottom view of another embodiment of a current sensor 400. FIG. 7 illustrates a perspective view of current sensor 400 attached to a printed circuit board (PCB) 420. Current sensor 400 is a bare die current sensor. In one embodiment, current sensor 400 provides current sensor 106 previously described and illustrated with reference to FIG. 1. Current sensor 400 includes a semiconductor die 402, an isolation layer 410, vias 412, and a sintered metal layer 408.

Semiconductor die 402 includes three magnetic field sensors 404*a*, 404*b*, and 404*c* and other elements (e.g., contacts, power amplifiers, protection diodes, resistors, and other circuit elements) electrically coupled to magnetic field sensors 404*a*, 404*b*, and 404*c*. In other embodiments, semiconductor die 402 includes another suitable number of magnetic field sensors. In this embodiment, magnetic field sensors 404*a*, 404*b*, and 404*c* include Hall sensors or other suitable magnetic field sensors. Isolation layer 410 covers the face of semiconductor die 402 and laterally surrounds vias 412. Each via 412 includes a conductive material that electrically couples semiconductor die 402 to a contact 408*b*. Contacts 408*b* are part of sintered metal layer 408.

Portion 408*a* of sintered metal layer 408 provides the current conductor for current sensor 400. Portion 408*a* of sintered metal layer 408 is M-shaped such that magnetic field sensor 404*a* is located between a first leg and the center portion of the M-shaped conductor, magnetic field sensor 404*b* is located in the center portion of the M-shaped conductor, and magnetic field sensor 404*c* is located between the second leg and the center portion of the M-shaped conductor. In this way, a differential current sensor is provided that rejects external disturbance magnetic fields. In other embodiments, portion 408*a* of sintered metal layer 408 has other suitable shapes based on the number, type, and location of the magnetic field sensors in semiconductor die 402. For example, in another embodiment, portion 408*a* of sintered metal layer 408 is U-shaped such that magnetic field sensor 404*a* is located on a first side of the U-shaped conductor, magnetic field sensor 404*b* is located in the center portion of the U-shaped conductor, and magnetic field sensor 404*c* is located on a second side of the U-shaped conductor opposite the first side.

Portions 408*b* of sintered metal layer 408 are coupled to conductive lines 420*c* of PCB 420. In one embodiment, conductive lines 420*c* of PCB 420 are electrically coupled to a host to receive power from the host for current sensor 400 and to provide current measurement signals to the host from current sensor 400. A first side of portion 408*a* of sintered metal layer 408 is coupled to conductive line 420*a* of PCB 420. A second side of portion 408*a* of sintered metal layer 408 opposite the first side is coupled to conductive line 420*b* of PCB 420. Conductive lines 420*a* and 420*b* are electrically coupled to a circuit such that the current to be measured passes through portion 408*a* of sintered metal layer 408. A current passing through portion 408*a* of sintered metal layer 408 generates a positive magnetic field at magnetic field sensors 404*a* and 404*c* or at magnetic field sensor 404*b* and a negative magnetic field at the other of magnetic field sensors 404*a* and 404*c* or magnetic field sensor 404*b*. In this way, current sensor 400 measures the magnetic field generated by sintered metal layer 408 differentially and rejects external disturbance magnetic fields.

Semiconductor die 402, isolation layer 410, and sintered metal layer 408 are fabricated using a process similar to the process used to fabricate current sensor 120 previously described and illustrated with reference to FIG. 2. In this embodiment, isolation layer 410 has a thickness of approximately 12 μm and sintered metal layer 408 has a thickness between 20 μm and 50 μm. In other embodiments, isolation layer 410 has another suitable thickness and sintered metal layer 408 has another suitable thickness. Semiconductor die 402, isolation layer 410, and sintered metal layer 408 are then placed in a face down mounting arrangement on PCB 420 and soldered to PCB 420 or attached to PCB 420 using another suitable technique.

Figure 8:
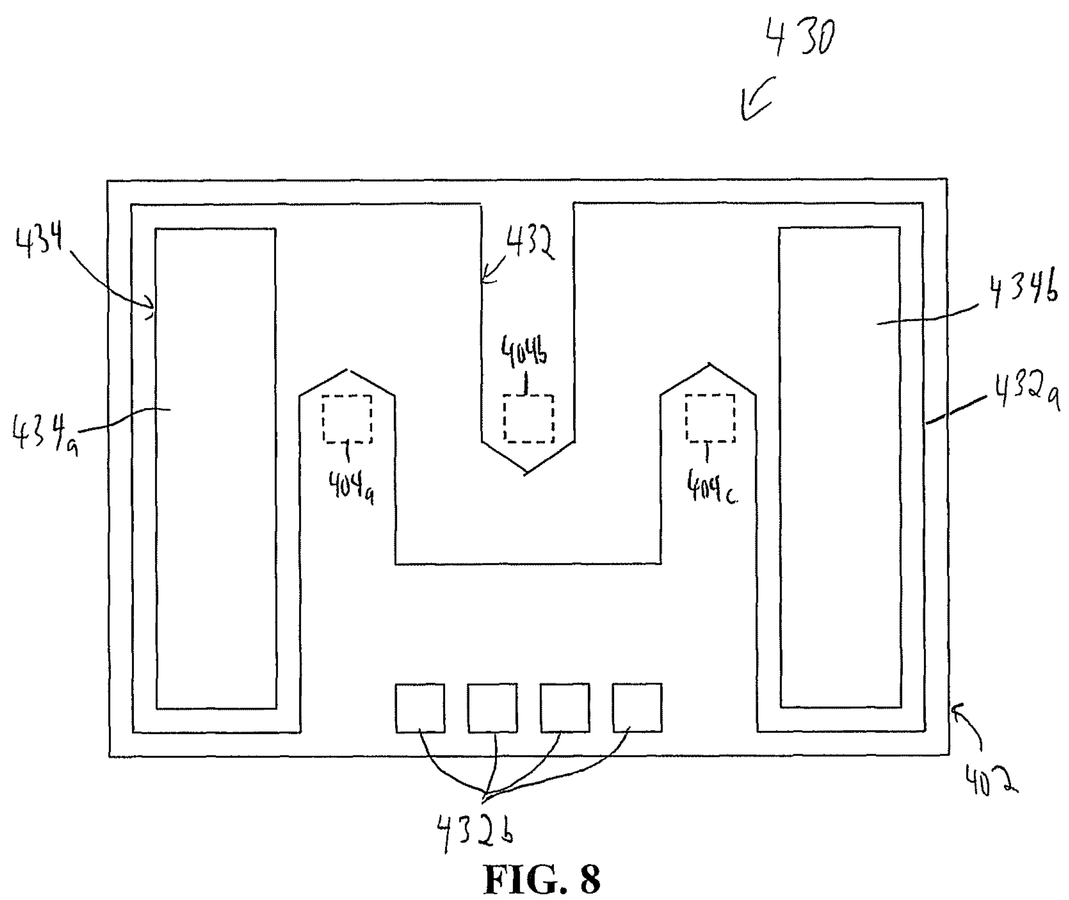
FIG. 8 illustrates a bottom view of another embodiment of a current sensor.

FIG. 8 illustrates a bottom view of another embodiment of a current sensor 430. In one embodiment, current sensor 430 provides current sensor 106 previously described and illustrated with reference to FIG. 1. Current sensor 430 is similar to current sensor 400 previously described and illustrated with reference to FIG. 6, except that in current sensor 430 sintered metal layer 408 is replaced by power metal layer 432 and current sensor 430 includes sintered metal layer 434. In this embodiment, portion 432*a* of power metal layer 432 provides the current conductor for current sensor 430. Contacts 432*b* are also part of power metal layer 432. Power metal layer 432 is thinner than sintered metal layer 408 previously described and illustrated with reference to FIG. 6, but power metal layer 432 provides an improved alignment to magnetic field sensors 404*a*, 404*b*, and 404*c*. Power metal layer 432 includes Cu, Al, or another suitable metal.

Sintered metal layer 434 includes a first portion 434*a* on a first side of power metal layer 432 and a second portion 434*b* on a second side of power metal layer 432 opposite the first side. Sintered metal layer 434 provides an improved thermal and electrical connection to another device, such as PCB 420 previously described and illustrated with reference to FIG. 7.

Figure 9:
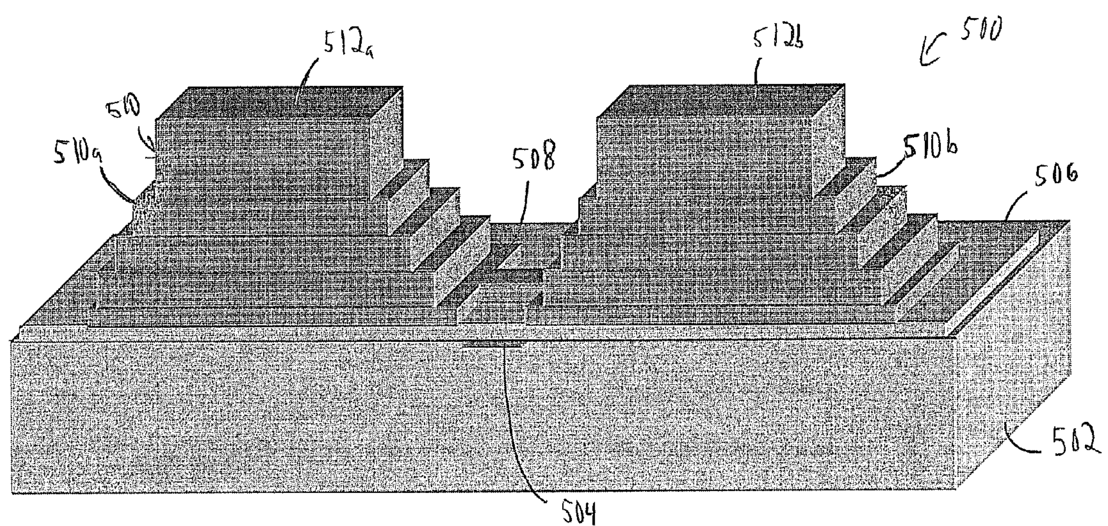
FIG. 9 illustrates a perspective cross-sectional view of another embodiment of a current sensor.

FIG. 9 illustrates a perspective cross-sectional view of another embodiment of a current sensor 500. In one embodiment, current sensor 500 provides current sensor 106 previously described and illustrated with reference to FIG. 1. Current sensor 500 includes a semiconductor die 502, an isolation layer 506, a power metal layer 508, and stacked sintered metal layers 510. In one embodiment, power metal layer 508 is replaced with another sintered metal layer.

Semiconductor die 502 includes one or more magnetic field sensors 504 and other elements (e.g., contacts, power amplifiers, protection diodes, resistors, and other circuit elements) electrically coupled to the one or more magnetic field sensors 504. In this embodiment, the one or more magnetic field sensors 504 include Hall sensors or other suitable magnetic field sensors. Isolation layer 506 covers the face of semiconductor die 502.

Power metal layer 508 provides the current conductor for current sensor 500. In this embodiment, power metal layer 508 includes one or more slits where one or more of the magnetic field sensors 504 are located. A current passing through power metal layer 508 generates a magnetic field at the one or more magnetic field sensors 504. In this way, current sensor 500 measures the magnetic field generated by power metal layer 508. In other embodiments, power metal layer 508 has other suitable shapes including a suitable number of slits based on the number, type, and location of the magnetic field sensors in semiconductor die 502.

Stacked sintered metal layers 510 includes a first stack of sintered metal layers 510*a* on a first side of power metal layer 508 and a second stack of sintered metal layers 510*b* on a second side of power metal layer 508 opposite the first side. Stacked sintered metal layers 510 provide an improved thermal and electrical connection to another device, such as PCB 420 previously described and illustrated with reference to FIG. 7. Each stack of sintered metal layers 510*a* and 510*b* includes two or more layers, such as four layers as illustrated in FIG. 9. In one embodiment, each additional layer of each stack of sintered metal layers 510*a* and 510*b* has a smaller area than the previous layer, such that a pyramid-shaped stacked structure is provided. The top layer 512*a* and 512*b* of each stack of sintered metal layers 510*a* and 510*b*, respectively, provides a contact area for soldering bond wires, gold bumps, or other suitable connection elements.

As illustrated in FIGS. 4A, 5A, and 6, embodiments provide current sensors where the topology of the sintered metal layer has a relatively large profile to keep contacting elements such as clips, bond wires, bumps and balls, or solder paste distant from the edge of the semiconductor die and distant from the magnetic field sensors on the surface of the semiconductor die. Clips and lead frame parts are typically coated by Ni, which is magnetic, and which can give rise to disturbance magnetic fields at the magnetic field sensors. With a larger distance between the contacting elements and the magnetic field sensors, disturbance magnetic fields are reduced.

Embodiments provide current sensors with a sintered metal layer as the current leading wire. The sintered metal layer provides a low series impedance and a low contact resistance to clips, bond wires, bumps and balls, or solder paste. The sintered metal layer also provides low thermal resistance to clips, bond wires, bumps and balls, or solder paste. The sintered metal layer is chemically pure, thus having no magnetic pollution. The sintered metal layer also provides a reduced current density due to its thickness to avoid electromigration related problems.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:

a semiconductor die comprising a first magnetic field sensor;

an isolation material layer over the first magnetic field sensor, and a sintered metal layer over the isolation material layer, the sintered metal layer being electrically isolated from the first magnetic field sensor, wherein the first magnetic field sensor is configured to sense a magnetic field generated by a current passing through the sintered metal layer, wherein the die comprises a second magnetic field sensor, and wherein the first magnetic field sensor and the second magnetic field sensor are configured to differentially sense a magnetic field generated by a current passing through the sintered metal layer, wherein the sintered metal layer extends in a direction parallel to the semiconductor die in the shape of an I having a narrower center portion and wider end portions at each end of the I, wherein the first magnetic field sensor is located adjacent one side of the center portion of the I, and wherein the second magnetic field sensor is located adjacent the other side of the center portion of the I opposite the first magnetic field sensor.

2. The integrated circuit of claim 1, wherein the sintered metal layer comprises one of Ag, Cu, and Au.

3. The integrated circuit of claim 1, wherein a thickness of the sintered metal layer is between 5 μm and 100 μm.

4. The integrated circuit of claim 1, wherein a thickness of the isolation material layer is less than a thickness of the sintered metal layer.

5. The integrated circuit of claim 1, wherein the first magnetic field sensor comprises one of a Hall sensor, a giant magnetoresistive sensor, an anisotropic magnetoresistive sensor, and a tunnel magnetoresistive sensor.

6. The integrated circuit of claim 1, further comprising:

a lead frame comprising at least two leads coupled to the sintered metal layer.

7. The integrated circuit of claim 6, wherein the at least two leads are coupled to the sintered metal layer via bond wires.

8. An integrated circuit comprising:

a semiconductor die comprising a first magnetic field sensor;

an isolation material layer over the first magnetic field sensor; and a sintered metal layer over the isolation material layer, the sintered metal layer being electrically isolated from the first magnetic field sensor, wherein the first magnetic field sensor is configured to sense a magnetic field generated by a current passing through the sintered metal layer, wherein the die comprises a second magnetic field sensor and a third magnetic field sensor, and wherein the first magnetic field sensor, the second magnetic field sensor, and the third magnetic field sensor are configured to differentially sense a magnetic field generated by a current passing through the sintered metal layer, wherein the sintered metal layer is M-shaped, wherein the first magnetic field sensor is located between a first leg and a center portion of the M-shaped sintered metal layer, wherein the second magnetic field sensor is located in the center portion of the M-shaped sintered metal layer, and wherein the third magnetic field sensor is located between a second leg and the center portion of the M-shaped sintered metal layer.

9. A method for fabricating a current sensor, the method comprising:

providing a semiconductor die comprising a first magnetic field sensor and a second magnetic field sensor;

applying an isolation layer over the first magnetic field sensor and the second magnetic field sensor;

applying a metal paste over the isolation layer; and drying and sintering the metal paste to provide a sintered metal layer over the isolation layer, the sintered metal layer being electrically isolated from the first magnetic field sensor and the second magnetic field sensor, wherein the sintered metal layer extends in a direction parallel to the semiconductor die in the shape of an I having a narrower center portion and wider end portions at each end of the I, wherein the first magnetic field sensor is located adjacent one side of the center portion of the I, and wherein the second magnetic field sensor is located adjacent the other side of the center portion of the I opposite the first magnetic field sensor.

10. The method of claim 9, wherein applying the metal paste comprises ink jet printing of the metal paste over the isolation layer.

11. The method of claim 9, wherein applying the metal paste comprises screen printing the metal paste over the isolation layer.

12. The method of claim 9, wherein applying the metal paste comprises stencil printing of the metal paste over the isolation layer.

13. The method of claim 9, wherein drying and sintering the metal paste comprises drying and sintering the metal paste at a temperature between 80° C. and 400° C.

14. The method of claim 9, further comprising:

coupling at least two leads of a lead frame to the sintered metal layer.

15. The method of claim 9, further comprising:

applying an adhesion promoting metal layer over the isolation layer prior to applying the metal paste.

16. An integrated circuit comprising:

a semiconductor die comprising a first magnetic field sensor;

an isolation material layer over the first magnetic field sensor; and a sintered metal layer over the isolation material layer, the sintered metal layer being electrically isolated from the first magnetic field sensor, wherein the first magnetic field sensor is configured to sense a magnetic field generated by a current passing through the sintered metal layer, wherein the die comprises a second magnetic field sensor and a third magnetic field sensor, and wherein the first magnetic field sensor, the second magnetic field sensor, and the third magnetic field sensor are configured to differentially sense a magnetic field generated by a current passing through the sintered metal layer, wherein the sintered metal layer is U-shaped, wherein the first magnetic field sensor is located on a first side of the U-shaped sintered metal layer, wherein the second magnetic field sensor is located in a center portion of the U-shaped sintered metal layer, and wherein the third magnetic field sensor is located on a second side of the U-shaped sintered metal layer opposite the first side.

* * * * *